(12) United States Patent
Wulbern et al.

(10) Patent No.: US 12,345,791 B2
(45) Date of Patent: Jul. 1, 2025

(54) SELF-NAVIGATION IN THREE-DIMENSIONAL MAGNETIC RESONANCE IMAGING

(71) Applicant: KONINKLIJKE PHILIPS N.V., Eindhoven (NL)

(72) Inventors: Jan Hendrik Wulbern, Hamburg (DE); Tim Nielsen, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 970 days.

(21) Appl. No.: 16/982,724

(22) PCT Filed: Mar. 21, 2019

(86) PCT No.: PCT/EP2019/057094
§ 371 (c)(1),
(2) Date: Sep. 21, 2020

(87) PCT Pub. No.: WO2019/180145
PCT Pub. Date: Sep. 26, 2019

(65) Prior Publication Data
US 2021/0003653 A1    Jan. 7, 2021

(30) Foreign Application Priority Data
Mar. 22, 2018   (EP) .................................... 18163244

(51) Int. Cl.
*G06K 9/00*     (2022.01)
*G01R 33/48*    (2006.01)
(Continued)

(52) U.S. Cl.
CPC ..... *G01R 33/5676* (2013.01); *G01R 33/4826* (2013.01); *G01R 33/5608* (2013.01);
(Continued)

(58) Field of Classification Search
CPC .......... G01R 33/5676; G01R 33/56509; G01R 33/4826; G01R 33/5608; G01R 33/5611;
(Continued)

(56) References Cited

U.S. PATENT DOCUMENTS 9,453,898 B2    9/2016   Nielsen et al.
9,714,998 B2 *  7/2017   Krueger ............. G01R 33/5676
(Continued)

OTHER PUBLICATIONS

Feng Li et al: "Motion-Resolved Golden-Angle Radial Sparse MRI Using Variable-Density Stack-of-Stars Sampling", Proceedings of the International Society for Magnetic Resonance in Medicine, vol. 24, 1091, Apr. 22, 2016 (Apr. 22, 2016), XP040682133.
(Continued)

*Primary Examiner* — Gregory A Morse
*Assistant Examiner* — Kevin M Coomber (57) ABSTRACT

The invention provides for a medical imaging system (100, 300) comprising: a memory (110) for storing machine executable instructions (120) and a processor (104) for controlling the medical imaging system. Execution of the machine executable instructions causes the processor to: receive (200) magnetic resonance imaging data (122) descriptive of a subject (318), wherein the magnetic resonance imaging data is segmented into sequential data portions (124), wherein the magnetic resonance imaging data was acquired according to a three-dimensional magnetic resonance imaging protocol, wherein the magnetic resonance data within each of the sequential data portions is sampled in-plane using a rotating k-space sampling profile, wherein the magnetic resonance data within each of the sequential data portions is sampled using a segmented phase encoding in a thru-plane direction; and reconstruct (202) a navigator image (128) for each of the sequential data portions according to the three-dimensional magnetic resonance imaging protocol.

15 Claims, 4 Drawing Sheets

(51) Int. Cl.
| | |
|---|---|
| *G01R 33/56* | (2006.01) |
| *G01R 33/565* | (2006.01) |
| *G01R 33/567* | (2006.01) |
| *G06T 7/20* | (2017.01) |
| *G06T 11/00* | (2006.01) |

(52) U.S. Cl.
CPC .......... *G01R 33/56509* (2013.01); *G06T 7/20* (2013.01); *G06T 11/006* (2013.01); *G06T 2200/04* (2013.01); *G06T 2207/10088* (2013.01); *G06T 2207/30004* (2013.01); *G06T 2210/41* (2013.01)

(58) Field of Classification Search
CPC ..... G01R 33/561; G06T 7/20; G06T 2200/04; G06T 2207/10088; G06T 2207/30004; G06T 2210/41; G06T 11/006
See application file for complete search history.

(56) References Cited

U.S. PATENT DOCUMENTS

| | | | |
|---|---|---|---|
| 2014/0035582 | A1 | 2/2014 | Boernert et al. |
| 2015/0015255 | A1 | 1/2015 | Krueger et al. |
| 2015/0212182 | A1* | 7/2015 | Nielsen ............ G01R 33/56509 702/191 |
| 2015/0276909 | A1 | 10/2015 | Kawaji et al. |
| 2015/0355301 | A1 | 12/2015 | Zhang |
| 2016/0252596 | A1* | 9/2016 | Nielsen ............ G01R 33/56509 324/309 |
| 2016/0334488 | A1 | 11/2016 | Bieri et al. |
| 2017/0035298 | A1 | 2/2017 | Contijoch et al. |
| 2017/0332936 | A1 | 11/2017 | Wang et al. |
| 2018/0106879 | A1* | 4/2018 | Johnson ............ G01R 33/5673 |
| 2019/0113587 | A1 | 4/2019 | Paulson et al. |
| 2019/0242965 | A1 | 8/2019 | Nielsen et al. |

OTHER PUBLICATIONS

International Search Report and Written Opinion from PCT/EP2019/057094 mailed Jun. 28, 2019.

Schär M.et al:"3D Golden-Angle Spiral Sparse Parallel-Imaging for Lumen Area Measurements of the Entire Proximal and Mid-Segments of the Coronary Arteries in ; Breath-Hold", Pro0eedings 0f the Internati0nal S0ciety f0r Magnetic Res0nance in Medicine, 25th Annual Meeting and Exhibiti0n, H0n0lulu,HI, USA, Apr. 22-27, 2017,vol. 25, 2784, Apr. 7, 2017.

Gamper U et al: "Compressed sensing in dynamic MRI", Magnetic Resonance in Medicine, John Wiley & Sons, Inc, US, vol. 59, No. 2,Feb. 1, 2008 (Feb. 1, 2008), pp. 365-373,XP007909390, ISSN: 0740-3194, DDI: 10.1002/MRM.21477 [retrieved on Jan. 28, 2008]col. 366, paragraph 3.

Van Heeswijk Ruud B et al: "Motion compensation strategies in magnetic resonance imaging", Critical Reviews in Biomedical Engineer, CRC Press, Boca Raton, PL, US, vol. 40, No. 2, Jan. 1, 2012 (Jan. 1, 2012), pp. 99-119.

Giuseppe Valvano et al: "Variable density randomized stack of spirals (VDR-SoS) for compressive sensing MRI",Magnetic Resonance in Medicine.,vol. 76, No. 1, Jul. 29, 2015 (Jul. 29, 2015), pp. 59-69.

Ashley G Anderson et al: "Retrospective registration-based MRI motion correction with interleaved radial trajectories", 2011 8th IEEE International Symposium on Biomedical Imaging: From Nano to Macro (ISBI 2011), IEEE, United States, Mar. 30, 2011 (Mar. 30, 2011), pp. 1528-1531.

Bammer R et al: "Augmented generalized Sense reconstruction to correct for rigid body motion", Magnetic Resonance in Medicine, John Wiley & Sons, Inc, US,vol. 57, Dec. 26, 2006 (Dec. 26, 2006), pp. 90-102.

Feng et al., "Golden-angle radial sparse parallel MRI: combination of compressed sensing, parallel imaging, and golden-angle radial sampling for fast and flexible dynamic volumetric MRI" MRM72, p. 707-717 (2014).

Trotier et al.USPIO Enhanced 3D-Cine Self-Gated Cardiac MRI Based on a Stack of Stars Golden Angle Short Echo Time Sequence . . . J. Magn. Reson. Imaging 2016, Accepted for publication Dec. 23, 2015.

* cited by examiner

SELF-NAVIGATION IN THREE-DIMENSIONAL MAGNETIC RESONANCE IMAGING

CROSS REFERENCE TO RELATED APPLICATIONS

This application is a U.S. national phase application of International Application No. PCT/EP2019/057094 filed on Mar. 21, 2019, which claims the benefit of EP Application Serial No. 18163244.9 filed on Mar. 22, 2018 and is incorporated herein by reference.

FIELD OF THE INVENTION

The invention relates to magnetic resonance imaging, in particular to navigators for three-dimensional magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field. During an MRI scan, Radio Frequency (RF) pulses generated by a transmitter antenna or antenna element cause perturbations to the local magnetic field, and RF signals emitted by the nuclear spins are detected by a receiver antenna or an array of antenna elements. These RF signals are used to construct the MRI images. These antennas or antenna elements can also be referred to as coils. The term coil is often used interchanbably to descrive either an antenna or an antenna element. Further, the transmitter and receiver antennas can also be integrated into a single transceiver antenna that performs both functions. It is understood that the use of the term transceiver antenna also refers to systems where separate transmitter and receiver antennas are used. The transmitted RF field is referred to as the B1 field. During longer scan the subject can have internal or external motion which corrupts the data and results in images with blurs or artifacts.

In parallel imaging techniques multiple antenna elements are used to acquire data simultaneously. Coil sensitivity maps (CSM) contain spatial sensitivity of all the antenna elements. In this case a "coil" refers to an antenna element. The coil sensitivity maps are used to combine the data acquired using each of the individual antenna elements into a single composite image. Parallel imaging greatly accelerates the acquisition of the magnetic resonance image.

United States patent application publication US 2016/0334488 A1 discloses a magnetic resonance imaging (MRI) method in which a sample is subjected to a gradient echo imaging sequence having a plurality of basic sequence elements each of which includes a radiofrequency (RF) pulse, at least one frequency encoding gradient moment $k_x$ for generating a magnetic resonance (MR) signal, at least one first phase encoding gradient moment $k_y$ for phase encoding the MR signal and a data acquisition period during which k-space data reflecting the MR signal are acquired. The frequency encoding gradient moment $k_x$ and the first phase encoding gradient moment $k_y$ are applied such during the data acquisition period of each basic sequence element, that the k-space data are acquired in a radial direction and asymmetrically with respect to the center of k-space in the direction from the periphery towards the center of k-space.

SUMMARY OF THE INVENTION

The invention provides for a medical imaging system, a computer program product, and a method in the independent claims. Embodiments are given in the dependent claims.

A problem with magnetic resonance imaging in general is that the subject may move, either voluntarily or involuntarily, during the acquisition of a magnetic resonance image. Navigators may be used to track or describe the motion of a subject during the acquisition of magnetic resonance data. Embodiments may derive navigators from the magnetic resonance data itself as it is acquired and be used for either retrospective correction or prospective correction of the magnetic resonance data to correct or compensate for subject motion. Embodiments use a three-dimensional acquisition that uses an altered k-space sampling pattern.

The k-space is sampled using a rotating k-space sampling profile, such as a stack-of-stars or stack-of-spirals trajectory, in-plane and uses phase-encoding in a thru-plane direction. The thru-plane direction is orthogonal to the in-plane directions. The phase encoding in the thru-plane direction is performed in a segmented fashion: The phase encoding is varied as the k-space sampling profile is rotated. The advantage of this is that this causes the entire three-dimensional k-space to be sampled roughly. The acquired magnetic resonance data can be divided into sequential data portions. Each of the sequential data portions contains enough data sampled in k-space that it can be used to reconstruct a navigator image. The resulting navigator image or each of the sequential data portions can then be used for motion correction.

This may be accomplished by performing a three-dimensional magnetic resonance imaging protocol and altering where and when k-space is sampled.

In one aspect the invention provides for a medical imaging system. The medical imaging system comprises a memory for storing machine-executable instructions. The medical imaging system further comprises a processor for controlling the medical imaging system.

Execution of the machine-executable instructions causes the processor to receive magnetic resonance data descriptive of a subject. The magnetic resonance imaging data is segmented into sequential data portions. The magnetic resonance imaging data was acquired according to a three-dimensional magnetic resonance imaging protocol. The magnetic resonance data within each of the sequential data portions is sampled in-plane using a rotating k-space sampling profile. The magnetic resonance data within each of the sequential data portions is sampled using a segmented phase encoding in a through-plane direction. The effect of using the segmented phase encoding in the through-plane direction and the rotation of the k-space sampling profile in the in-plane is that each of the sequential data portions can be reconstructed into a magnetic resonance image. In this case the magnetic resonance image is labeled as a navigator image for each of the sequential data portions. Execution of the machine-executable instructions further causes the processor to reconstruct a navigator image for each of the sequential data portions according to the three-dimensional magnetic resonance imaging protocol.

Because of the k-space is sampled using the rotating k-space sampling profile in-plane and the segmented through-plane phase encoding the magnetic resonance imaging data is broken into the sequential data portions and each of the sequential data portions can be used to reconstruct a navigator image. These may be used for retrospective or prospective techniques for reducing the effects of motion of the subject during the acquisition of the magnetic resonance imaging data.

In another embodiment, the memory further contains pulse sequence commands configured for acquiring magnetic resonance imaging data according to the three-dimensional magnetic resonance imaging protocol. The three-dimensional magnetic resonance imaging protocol is configured for sampling the magnetic resonance data in-plane using the rotating k-space sampling profile. The three-dimensional magnetic resonance imaging protocol is configured for sampling the magnetic resonance data using the segmented phase encoding in the through-plane direction. Execution of the machine-executable instructions further cause the processor to control the magnetic resonance imaging system to acquire the magnetic resonance imaging data by controlling the magnetic resonance imaging system with the pulse sequence commands. The pulse sequence commands are configured for acquiring the sequential data portions sequentially.

In another embodiment, execution of the machine-executable instructions further causes the processor to calculate a subject motion value for each navigator image. Execution of the machine-executable instructions further cause the processor to identify at least one rejected data portion selected from the sequential data portions if the subject motion value is above a predetermined threshold. Execution of the machine-executable instructions further cause the processor to control the magnetic resonance imaging system to reacquire the at least one rejected data portion using the pulse sequence commands.

For example, the navigator image for each of the sequential data portions could be compared to a reference or initial navigator image that is measured. For example, the initial navigator image may be the first navigator image acquired. The navigator image as it is reconstructed could be compared to this initial navigator image. If the motion of the subject is above a predetermined threshold then this may be used to cause the magnetic resonance imaging system to reacquire the at least one rejected data portion. This may have the effect of improving the quality of the magnetic resonance imaging data which can be reconstructed into a magnetic resonance image.

In another embodiment, execution of the machine-executable instructions further causes the processor to reconstruct the navigator image as each of the sequential data portions is acquired. In this case the navigator image is essentially reconstructed on the fly. Execution of the machine-executable instructions further cause the processor then to calculate a displacement vector field for each navigator image as each of the sequential data portions is acquired. Execution of the machine-executable instructions then further cause the processor to modify the pulse sequence commands to compensate for subject motion detected in the displacement vector field as each of the sequential data portions is acquired. In this embodiment the displacement vector field for each of the navigator images is used to adjust the pulse sequence commands such as for example the region of interest so that it may possibly move with the subject as the subject moves. This may have the benefit of improving the quality of magnetic resonance data so that it may result in an end magnetic resonance image that has fewer motion artifacts.

In another embodiment, execution of the machine executable instructions further causes the processor to reconstruct a magnetic resonance image using the magnetic resonance imaging data.

In another embodiment, execution of the machine-executable instructions further causes the processor to calculate a navigator for each navigator image of each of the sequential data portions. This may be beneficial because the navigator can then be used for motion correction of the magnetic resonance data.

In another embodiment, execution of the machine-executable instructions further causes the processor to calculate a motion compensated magnetic resonance image according to the three-dimensional magnetic resonance imaging protocol using the displacement vector field from each navigator image. The displacement vector field may for example be used to perform motion correction either in image or k-space.

In another embodiment, the navigator is a displacement vector field for each navigator image.

In another embodiment, the navigator is an edge detection or edge detections in each navigator image. The location of edges may be compared to each other to identify subject motion.

In another embodiment, the navigator is a mapping of a deformable body model to each navigator image.

In another embodiment, the navigator is a registration to an anatomical atlas for each navigator image.

In another embodiment, execution of the machine-executable instructions further causes the processor to sort the sequential data portions into a set of predetermined bins using the navigator. Execution of the machine-executable instructions further causes the processor to reconstruct a set of motion resolved magnetic resonance images by reconstructing the sequential data portions sorted into the predetermined bins. In this embodiment the navigator is first used to place the sequential data portion into bins such that the magnetic resonance data within each of the predetermined bins has the same motion state for the subject. This may be useful in reconstructing images which resolves such things as breathing or heart phase.

In another embodiment, the navigator image for each of the sequential data portions has a spatial resolution between 2 mm and 3 mm.

In another embodiment, the navigator image for each of the sequential data portions has a spatial resolution between 2 mm and 10 mm.

In another embodiment, the navigator image for each of the sequential data portions has a spatial resolution between 1 and 12 mm.

In another embodiment, the navigator image for each of the sequential data portions has a spatial resolution between 1 mm and 30 mm.

In another embodiment, the navigator image for each of the sequential data portions is reconstructed using parallel imaging both in-plane and/or through-plane. This may be beneficial because it enables lower resolution navigator images to be reconstructed accurately.

In another embodiment the three-dimensional magnetic resonance imaging protocol is a parallel imaging magnetic resonance imaging protocol.

In another embodiment the parallel imaging reconstruction is a SENSE reconstruction.

In another embodiment the navigator image is reconstructed according to a compressed sensing magnetic resonance imaging protocol. In this case the three-dimensional magnetic resonance imaging protocol is a compressed sensing magnetic resonance imaging protocol.

During navigator reconstruction, a challenge for the navigator reconstruction is possibly a lower or reduced amount of k-space data that is available—i.e. incomplete spatial encoding. The combination of parallel imaging and compressed sensing techniques may be complementary. Parallel imaging is usually understood in the sense that coil sensitivity information is used to augment spatial encoding by gradients. I.e. missing k-space data can be inferred from the acquired k-space data and the known coil sensitivities. Compressed sensing tries to infer the missing data by forcing the reconstructed image to conform to some model (e.g. sparse representation in some domain). It may therefore be possible to obtain an improved navigator reconstruction by combining the two techniques.

In another embodiment, each of the navigator images is reconstructed using a non-uniform Fourier transform. This may be beneficial because it may enable quasi-random sampling of k-space to be used.

In another embodiment, the sequential data portions are quasi-random sampled in-plane by rotating the k-space sampling profile.

In another embodiment, the sequential data portions are quasi-random sampled by the segmented phase encoding.

In another embodiment, the combination of the sampling locations of the magnetic resonance imaging data in k-space and in phase encoding are unique. This means that the magnetic resonance data does not sample the same point in k-space more than once (with the possible exception of points on the rotation axis of the rotating k-space sampling).

In another embodiment, the rotating k-space sampling profile is any one of the following: a stack-of-stars sampling profile and a stack-of-spirals sampling profile.

In another aspect, the invention provides for a method of operating a medical imaging system. The method comprises receiving magnetic resonance imaging data descriptive of a subject. The magnetic resonance data was acquired according to a three-dimensional magnetic resonance imaging protocol. The magnetic resonance data within each of the sequential data portions is sampled at in-plane using a rotating k-space sampling profile. The magnetic resonance data within each of the sequential data portions is sampled using a segmented phase encoding in a through-plane direction. The method further comprises reconstructing a navigator image for each of the sequential data portions according to the three-dimensional magnetic resonance imaging protocol.

In another aspect, the invention provides for a computer program product comprising machine-executable instructions for execution by a processor controlling the medical imaging system. Execution of the machine-executable instructions causes the processor to receive magnetic resonance imaging data descriptive of a subject. The magnetic resonance imaging data was acquired according to a three-dimensional magnetic resonance imaging protocol. The magnetic resonance data within each of the sequential data portions is sampled in-plane using a rotating k-space sampling profile. The magnetic resonance data within each of the sequential data portions is sampled using a segmented phase encoding in a through-plane direction.

Execution of the machine-executable instructions further causes the processor to reconstruct a navigator image for each of the sequential data portions according to the three-dimensional magnetic resonance imaging protocol.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a 'circuit,' 'module' or 'system'. Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, random access memory (RAM), read only memory (ROM), an optical disk, a magneto-optical disk, and the register file of the processor. Examples of optical disks include compact disks (CD) and digital versatile disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. 'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising a 'processor' should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as C or similar programming languages and compiled into machine executable instructions. In some instances, the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the internet using an internet service provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE 488 port, Bluetooth connection, wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, a tactile electronic display, a Braille screen, a cathode ray tube (CRT), a storage tube, a bi-stable display, an electronic paper, a vector display, a flat panel display, a vacuum fluorescent display (VF), light-emitting diode (LED) displays, an electroluminescent display (ELD), plasma display panels (PDP), a liquid crystal display (LCD), organic light-emitting diode displays (OLED), a projector, and a head-mounted display.

Magnetic Resonance (MR) data is defined herein as being the recorded measurements of radio frequency signals emitted by atomic spins using the antenna of a magnetic resonance apparatus during an MRI scan. MR data is an example of medical image data. An MR image is defined herein as being the reconstructed two or three-dimensional visualization of anatomic data contained within the MRI data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
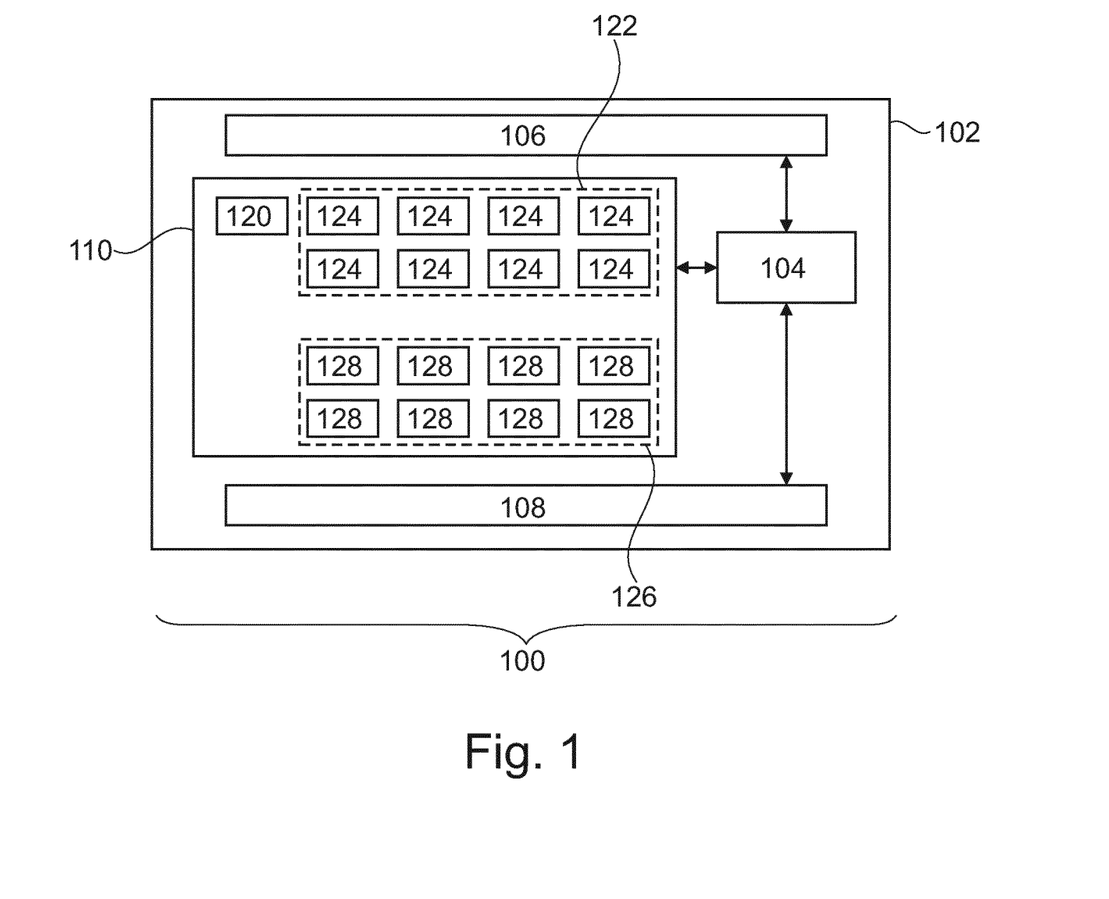
FIG. 1 illustrates an example of a medical imaging system.

FIG. 1 shows an example of a medical imaging system 100. The medical imaging system 100 comprises a computer 102. The computer comprises a processor 104 that is shown as being optionally connected to a hardware interface 106. The processor 104 is also optionally shown as being connected to a user interface 108. The processor 104 is shown as being connected to a memory 110. The memory 110 may be any combination of memory which is accessible to the processor 104. This may include such things as main memory, cached memory, and also non-volatile memory such as flash RAM, hard drives, or other storage devices. In some examples the memory 110 may be considered to be a non-transitory computer-readable medium.

The hardware interface 106 may for example be used for controlling other components of the medical imaging system 100 such as a magnetic resonance imaging system if one is available. The hardware interface 106 may also comprise network components so that the processor 104 can send and receive data via a computer network.

The memory 110 is shown as containing machine-executable instructions 120. The machine-executable instructions 120 enable the processor 104 to control other components of the medical imaging system 100 and/or to perform mathematical operations and/or image processing functions. The memory 110 is further shown as containing magnetic resonance imaging data 122 that is either received from an external source or system or from a component such as the magnetic resonance imaging system.

The magnetic resonance imaging data 122 is in the form of a number of sequentially acquired data portions 124. The memory 110 is further shown as containing a set of navigator images 126 which contains a navigator image 128 for each of the sequentially acquired data portions 124. The magnetic resonance data within each of the sequential data portions is sampled in-plane using a rotating k-space sampling profile. The magnetic resonance data within each of the sequentially acquired data portions 124 is further sampled using a segmented phase encoding in a through-plane direction. This has the effect of distributing the k-space sampling within each of the sequentially acquired data portions in a quasi-random fashion. This enables the construction of the navigator images 128.

Figure 2:
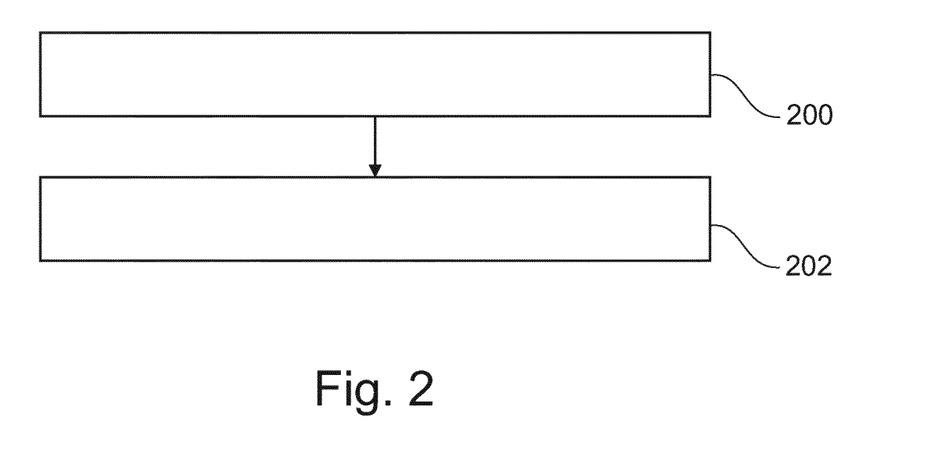
FIG. 2 shows a flow chart which illustrates an example of a method of operating the medical imaging system of FIG. 1.

FIG. 2 shows a flowchart which illustrates a method of operating the medical imaging system 100 of FIG. 1. First in step 200 the magnetic resonance imaging data 122 is received. Next in step 202 a navigator image 128 for each of the sequentially acquired data portions 124 is reconstructed according to the three-dimensional magnetic resonance imaging protocol.

Figure 3:
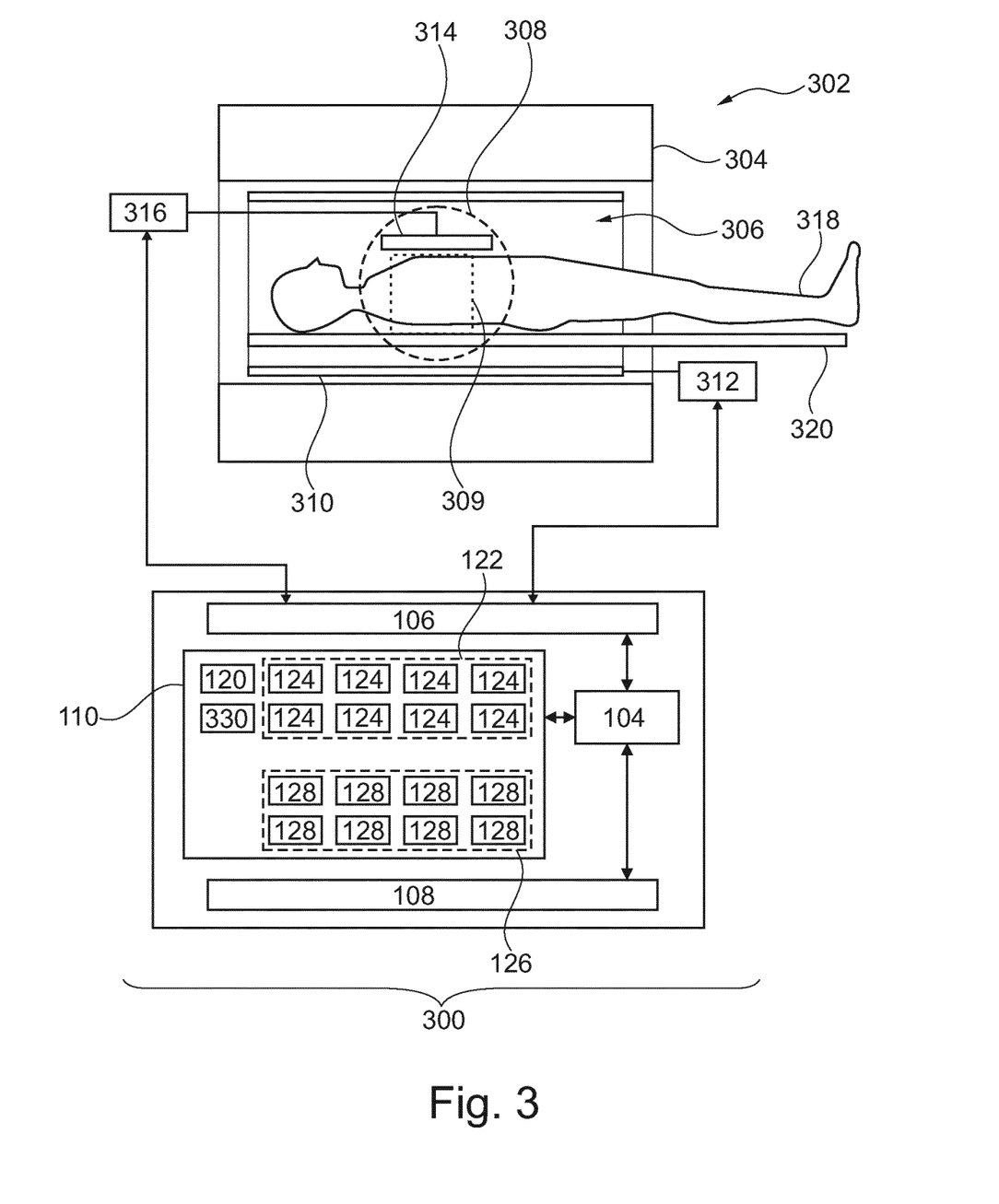
FIG. 3 illustrates a further example of a medical imaging system.

FIG. 3 shows a further example of a medical imaging system 300. The medical imaging system 300 of FIG. 3 is similar to the medical imaging system 100 in FIG. 1. The medical imaging system 300 of FIG. 3 additionally comprises a magnetic resonance imaging system 302. The medical imaging system 300 in FIG. 3 is shown as additionally comprising a magnetic resonance imaging system 302.

The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 306 of the magnet 304, which is illustratively cylindrical, there is an imaging zone 308 where the magnetic field is strong and uniform enough to perform magnetic resonance imaging. A region of interest 309 is shown within the imaging zone 308. The magnetic resonance data is typically acquired for the region of interest. A subject 318 is shown as being supported by a subject support 320 such that at least a portion of the subject 318 is within the imaging zone 308 and the region of interest 309.

Within the bore 306 of the magnet there is also a set of magnetic field gradient coils 310 which is used for acquisition of magnetic resonance data to spatially encode magnetic spins within the imaging zone 308 of the magnet 304. The magnetic field gradient coils 310 are connected to a magnetic field gradient coil power supply 312. The magnetic field gradient coils 310 are intended to be representative. Typically magnetic field gradient coils 310 contain three separate sets of coils for spatial encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio frequency coil 314 is connected to a radio frequency transceiver 316 via the processor 104 as shown. The radio frequency coil 314 and radio frequency transceiver 316 may be replaced by separate transmit and receive coils and a separate transmitter and receiver. It is understood that the radio frequency coil 314 and the radio frequency transceiver 316 are representative. The radio frequency coil 314 is intended to also represent a dedicated transmit antenna and a dedicated receive antenna. Likewise the radio frequency transceiver 316 may also represent a separate transmitter and receiver. The radio frequency coil 314 may also have multiple receive/transmit elements and the radio frequency transceiver 316 may have multiple receive/transmit channels. For example if a parallel imaging technique such as is performed, the radio frequency coil 314 will have multiple coil elements.

The radio frequency transceiver 316 and the magnetic field gradient coil power supply 312 are shown as being connected to the hardware interface 106 of the computer 102. The memory 110 is shown as additionally containing pulse sequence commands 330. The processor 104 can use the pulse sequence commands 330 to control the magnetic resonance imaging system 302 to acquire the magnetic resonance imaging data 122. The pulse sequence commands are either commands or data which may be converted into such commands that enables the processor 104 to control the magnetic resonance imaging system 302 to acquire the magnetic resonance imaging data 122.

Figure 4:
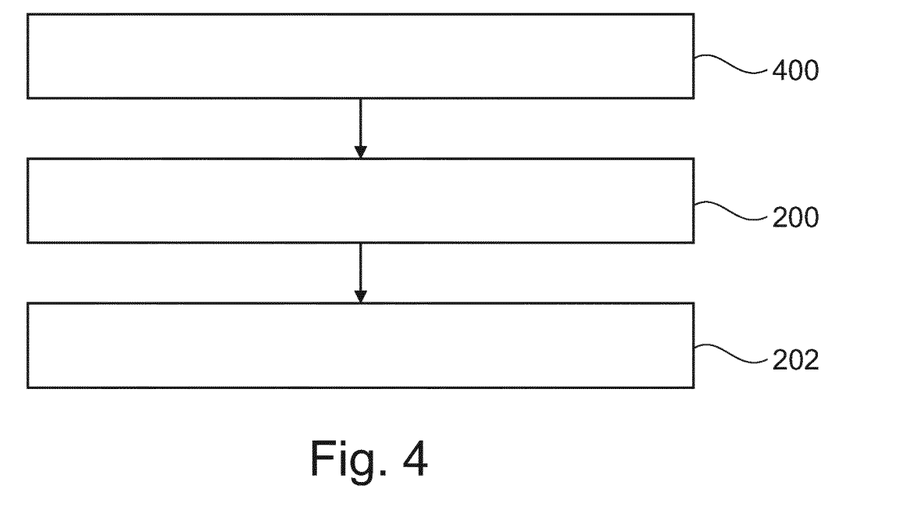
FIG. 4 shows a flow chart which illustrates an example of a method of operating the medical imaging system of FIG. 3.

FIG. 4 shows a flowchart which illustrates a method of operating the medical imaging system 300 of FIG. 3. The method starts with step 400 where the processor 104 uses the pulse sequence commands 330 to control the magnetic resonance imaging system 302 to acquire the magnetic resonance imaging data 122. The pulse sequence commands are configured for acquiring the magnetic resonance imaging data according to a three-dimensional magnetic resonance imaging protocol. The three-dimensional magnetic resonance imaging protocol is configured for sampling the magnetic resonance data as sequential data portions that are acquired sequentially. The three-dimensional magnetic resonance imaging protocol is configured for sampling the magnetic resonance data in-plane using a rotating k-space sampling profile. The three-dimensional magnetic resonance imaging protocol is configured for sampling the magnetic resonance data using the segmented phase encoding in the through-plane direction. After performing step 400 the method proceeds to step 200 and then step 202. Steps 200 and 202 are identical with the method illustrated in FIG. 2.

Examples may provide for a low-spatial, high-temporal resolution volume navigator (navigator image) derived from the MRI data acquired with a stack-of-stars or stack-of-spirals trajectory (rotating k-space sampling profile). High-temporal frame rate is achieved by undersampling in-plane and through-plane data. Quasi-random phase encoding combined with compressed-sensing (i.e., three-dimensional parallel imaging or three dimensional SENSE) reconstruction mitigate aliasing artefacts in through-plane direction Magnetic resonance tomography is a valuable imaging modality of the human body as it offers excellent soft tissue contrast without the use of ionizing radiation. A major disadvantage of MRI is its long acquisition time which, depending on the imaging volume and resolution may range from tens of seconds up to several minutes. As such the acquisition is prone to motion artefacts due to movements of the subject during the scan. This is particularly problematic if organs in the abdomen are under investigation, which are subject to respiratory or cardiac motion. Respiratory motion is commonly compensated by instructing the patient to hold his breath for the duration of image acquisition. This is only possible if the scan time is below the order of approximately 15 seconds and if the patient is able to hold his breath for the required time interval. To overcome this limitation gating or trigger techniques may be employed which result in prolonged scan time and reduced scan efficiency.

Acquisition of the k-space with radial trajectories (rotating k-space sampling profile) rather than Cartesian sampling reduces the problem of motion artefacts. Blurring and streaking artefacts are typical in images acquired with rotating readout, however are considered to be more benign than the ghosting artefacts observed with Cartesian trajectories.

Radial trajectories massively oversample the k-space center. A 3D variant of radial sampling is the Stack-of-Stars acquisition technique, where the through-plane direction of the k-space is encoded with Cartesian phase encoding steps and radial sampling is applied in-plane. Due to motion robustness considerations the Cartesian phase encoding steps form the inner acquisition loop and the radial increments form the outer loop. In other words, a set of projections of equal orientations perpendicular to the Cartesian direction is acquired before incrementing the acquisition angle.

With appropriate navigator signals the degree of motion artefacts may be reduced further by retrospective gating, soft-gating, or binning of the acquired data. Navigator signals may be supplied from external sensors (respiratory bellows, ECG, heart rate sensor, camera, etc.), MR-Navigators or derived from the acquired MR-data itself From a workflow perspective the navigator signal is ideally derived from the acquired MR data. External navigators either hinder the workflow as additional setup is required (e.g. bellows, etc.) or increase the cost of the MR-system if additional hardware is introduced (e.g. camera). Furthermore, external navigators like bellows or cameras only capture motion of the body contour rather than the actual organ or anatomy of interest.

On the other hand, MR-navigators typically increase the total acquisition time and may interfere with the acquired image data, reducing image quality. Internal navigators like pencil-beams can register the movement of an organ or pronounced contour (typically the air-tissue interface of the diaphragm), however are restricted to one dimension. Hence, the operator must decide a-priori which will be the predominant direction of motion.

An example navigator is derived from the acquired MR data, without extra workflow requirements of external navigators or overhead within the acquisition sequence (i.e. no prolonged scan time) and offers the unique ability to represent organ motion in all three spatial dimensions. The navigator is reconstructed from under-sampled subsets (sequential data portions of the magnetic resonance imaging data) of the total acquired MR data, not requiring additional acquisition time or interfering with the imaging sequence. The undersampling enables high temporal resolution with reduced spatial resolution. For navigation purposes reduced spatial resolution is acceptable as mainly the displacement of organ contours is of interest.

Displacement vector field calculated from a 3D navigator can directly be used in a motion compensated reconstruction.

Examples may change the acquisition order of a stack-of-stars or stack-of-spirals sequence such that it is possible to reconstruct low-resolution 3D volumes (navigator images) at a high frame rate. The volumes serve as a motion navigator.

Prerequisite for the reconstruction of low spatial resolution images from subsampled data may possibly be (pseudo-) random sampling scheme. In-plane a pseudo random profile distribution (e.g. golden-angle or derivatives like pseudo golden angle, tiny golden angle) ensures a quasi-uniform k-space coverage independent of the subset size and allows low-resolution reconstruction without streaking artefacts.

In through-plane direction a subset of phase encoding steps (segmented phase encoding in a thru-plane direction) which were acquired with quasi random phase encoding order is reconstructed without aliasing artefacts by using compressed sensing reconstruction.

In some examples, the data acquisition the order of acquisition may be as follows:

The radial increments follow a golden angle like sequence (e.g. golden angle, tiny golden angle, pseudo golden angle). A scan with a total of N radial projections per slice is segmented into subsets (sequential data portions) of $N_{sub}$ profiles (resulting in $N/N_{sub}$ radial projection subsets) with consecutive encoding numbers within a subset.

The encoding steps in the Cartesian dimension are divided into subsets, The distribution of encoding numbers must be chosen in a way which ensures that k-space is sampled (quasi-) uniformly by each subset. This order can be realized by either purely random distribution, a pseudo random (e.g. golden section) algorithm or by permutation (e.g. recursive bisection). A total of M encoding steps in axial direction is hence divided into subsets of $M_{sub}$ encoding numbers (resulting in $M/M_{sub}$ axial encoding subsets). The encoding steps of all subsets are mutually exclusive and collectively exhaustive.

The data acquisition is organized in 4 loops:

Loop over all $N/N_{sub}$ radial projection subsets.

Loop over all $M/M_{sub}$ axial encoding subsets.

Loop over all $N_{sub}$ radial projections of the current projection subset.

Loop over all $M_{sub}$ axial encoding step of the current encoding subset.

Reconstruction of data from the two inner most loops yields one time frame (a navigator image) of the navigator. The frame rate is hence given by $N_{sub}*M_{sub}*TR$. Alternate loop orders are possible as well, as long as sufficient radial projections and axial encodes are available for the reconstruction of a navigator frame.

As an example, consider a 3D abdominal scan of the liver with 1.5 mm in-plane in 3 mm through-plane resolution and 450×450×250 $mm^3$ FOV using M=56 z-encoding steps (possibly using parallel imaging or SENSE), N=525 radial projections per slice and a TR=3.5 ms. A 3D navigator reconstruction with $N_{sub}$=21 (25 radial subsets) and $M_{sub}$=8 (7 axial subsets) yields a 2 cm resolution in- and through-plane with a temporal update rate of 600 ms.

Reconstruction of the navigator image series can be performed by non-uniform Fourier transform in the non-Cartesian encoding directions ("gridding") with reduced resolution accounting for the subsampling with $N_{sub}$ radial projections. Compressed sensing reconstruction is used in the Cartesian encoding direction to compensate for the incoherent aliasing artefacts due to the subsampling of Cartesian encoding steps.

Pushing the lower limits of subsampling further and allowing higher navigator frame rates the compressed sensing reconstruction may be extended in the temporal dimension according to:

$$\vec{d}=\text{argmin}\{|E\cdot d-m|_2^2+\Delta\|T\cdot d\|\}$$

where d is the image series, T temporal total-variation operator (sparsifying transform), imposed on L1 norm, m is the acquired k-space data, E the encoding operator consisting of the non-uniform Fourier transform potentially combined coil sensitivity maps.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical imaging system
102 computer
104 processor
106 hardware interface
108 user interface
110 memory
120 machine executable instructions
122 magnetic resonance imaging data
124 sequentially acquired data portions
126 set of navigator images
128 navigator image
200 receive magnetic resonance imaging data descriptive of a subject
202 reconstruct a navigator image for each of the sequential data portions according to the three-dimensional magnetic resonance imaging protocol
300 medical imaging system
302 magnetic resonance imaging system
304 magnet
306 bore of magnet
308 imaging zone
309 region of interest
310 magnetic field gradient coils
312 magnetic field gradient coil power supply
314 radio frequency coil
316 transceiver
318 subject
320 subject support
330 pulse sequence commands
400 control the magnetic resonance imaging system to acquire the magnetic resonance imaging data using the pulse sequence commands

The invention claimed is:

1. A medical imaging system comprising:
a processor; and
a tangible, non-transitory computer readable medium that stores machine executable instructions, which when executed by the processor, causes the processor to:
receive magnetic resonance imaging data descriptive of a subject, wherein the magnetic resonance imaging data is segmented into sequential data portions, wherein the magnetic resonance imaging data was acquired according to a three-dimensional magnetic resonance imaging protocol, wherein the three-dimensional magnetic resonance imaging protocol is configured to sample the magnetic resonance data within each of the sequential data portions in-plane using a rotating k-space sampling profile, wherein the three-dimensional magnetic resonance imaging protocol is configured to further sample the magnetic resonance data within each of the sequential data portions using a segmented phase encoding in a thru-plane direction, wherein the segmented phase encoding is varied as the rotating k-space sampling profile is rotated, thereby distributing k-space sampling within each of the sequential data portions in a quasi random fashion;

reconstruct a navigator image for each of the sequential data portions based on the k-space sampling within each of the sequential data portions according to the three-dimensional magnetic resonance imaging protocol, and wherein the non-transitory computer readable medium further contains pulse sequence commands configured to acquire the magnetic resonance imaging data according to the three-dimensional magnetic resonance imaging protocol, wherein execution of the machine executable instructions further causes the processor to control the magnetic resonance imaging system to acquire the magnetic resonance imaging data using the pulse sequence commands, wherein the pulse sequence commands are configured to acquire the sequential data portions sequentially;

reconstruct each navigator image as each of the sequential data portions is acquired;

calculate a displacement vector field for each navigator image as each of the sequential data portions is acquired; and modify the pulse sequence commands to compensate for subject motion detected in the displacement vector field as each of the sequential data portions is acquired.

2. The medical imaging system of claim 1, wherein execution of the machine executable instructions further causes the processor to:
calculate a subject motion value for each navigator image;
identify at least one rejected data portion selected from the sequential data portions when the subject motion value is above a predetermined threshold; and
control the medical imaging system to re-acquire the at least one rejected data portion using the pulse sequence commands.

3. The medical imaging system of claim 1, wherein execution of the machine executable instructions further causes the processor to calculate a navigator for each navigator image of each of the sequential data portions.

4. The medical imaging system of claim 1, wherein execution of the machine executable instructions further causes the processor to calculate a navigator for each navigator image of each of the sequential data portions, wherein execution of the machine executable instructions further causes the processor to calculate a motion compensated magnetic resonance image according to the three-dimensional magnetic resonance imaging protocol using the displacement vector field from each navigator image.

5. The medical imaging system of claim 3, wherein the navigator is any one of the following:
a displacement vector field for each navigator image;
an edge detection in each navigator image;
a mapping of a deformable body model to each navigator image; or
a registration to an anatomical atlas for each navigator image.

6. The medical imaging system of claim 3, wherein execution of the machine executable instructions further causes the processor to:
sort the sequential data portions into a set of predetermined bins using the navigator; and
reconstruct a set of motion resolved magnetic resonance images by reconstructing the sequential data portions sorted into the set of predetermined bins.

7. The medical imaging system of claim 1 wherein the navigator image for each of the sequential data portions has a spatial resolution of any one of the following:
between 2 mm and 3 mm;
between 2 mm and 10 mm;
between 1 mm and 12 mm; and
between 1 mm and 30 mm.

8. The medical imaging system of claim 1, wherein the navigator image for each of the sequential data portions is reconstructed using any one of the following:
a compressed sensing magnetic resonance imaging protocol;
a parallel imaging reconstruction both in-plane and/or thru-plane; and
combinations thereof.

9. The medical imaging system of claim 1, wherein each of the navigator images is reconstructed using a non-uniform Fourier transform.

10. The medical imaging system of claim 1, wherein the rotating k-space sampling profile is any one of the following: a stack-of-stars sampling profile and a stack-of-spirals sampling profile.

11. A method of operating a medical imaging system, wherein the method comprises:
receiving magnetic resonance imaging data descriptive of a subject, wherein the magnetic resonance imaging data is segmented into sequential data portions, wherein the magnetic resonance imaging data was acquired according to a three-dimensional magnetic resonance imaging protocol, wherein the three-dimensional magnetic resonance imaging protocol is configured to sample the magnetic resonance data within each of the sequential data portions in-plane using a rotating k-space sampling profile, wherein the three-dimensional magnetic resonance imaging protocol is configured to further sample the magnetic resonance data within each of the sequential data portions using a segmented phase encoding in a thru-plane direction, wherein the segmented phase encoding is varied as the rotating k-space sampling profile is rotated, thereby distributing k-space sampling within each of the sequential data portions in a quasi random fashion;
reconstructing a navigator image for each of the sequential data portions based on the k-space sampling within each of the sequential data portions according to the three-dimensional magnetic resonance imaging protocol;
acquiring the magnetic resonance imaging data using pulse sequence commands according to the three-dimensional magnetic resonance imaging protocol wherein the pulse sequence commands are configured to acquire the sequential data portions sequentially;
reconstructing each navigator image as each of the sequential data portions is acquired;
calculating a displacement vector field for each navigator image as each of the sequential data portions is acquired; and
modifying the pulse sequence commands to compensate for subject motion detected in the displacement vector field as each of the sequential data portions is acquired.

12. A tangible, non-transitory computer readable medium that stores machine executable instructions, which when executed by a processor, causes the processor to:
receive magnetic resonance imaging data descriptive of a subject, wherein the magnetic resonance imaging data is segmented into sequential data portions, wherein the magnetic resonance imaging data was acquired according to a three-dimensional magnetic resonance imaging protocol, wherein the three-dimensional magnetic resonance imaging protocol is configured to sample the magnetic resonance data within each of the sequential data portions in-plane using a rotating k-space sampling profile, wherein the three-dimensional magnetic resonance imaging protocol is configured to further sample the magnetic resonance data within each of the sequential data portions using a segmented phase encoding in a thru-plane direction, wherein the segmented phase encoding is varied as the rotating k-space sampling profile is rotated, thereby distributing k-space sampling within each of the sequential data portions in a quasi random fashion; and reconstruct a navigator image for each of the sequential data portions based on the k-space sampling within each of the sequential data portions according to the three-dimensional magnetic resonance imaging protocol, and wherein the non-transitory computer readable medium further contains pulse sequence commands configured to acquire the magnetic resonance imaging data according to the three-dimensional magnetic resonance imaging protocol, wherein execution of the machine executable instructions further causes the processor to control the magnetic resonance imaging system to:

acquire the magnetic resonance imaging data using the pulse sequence commands, wherein the pulse sequence commands are configured to acquire the sequential data portions sequentially;

reconstruct each navigator image as each of the sequential data portions is acquired;

calculate a displacement vector field for each navigator image as each of the sequential data portions is acquired; and modify the pulse sequence commands to compensate for subject motion detected in the displacement vector field as each of the sequential data portions is acquired.

13. The tangible, non-transitory computer readable medium of claim 12, wherein the machine executable instructions, when executed by the processor, further cause the processor to:

calculate a subject motion value for each navigator image;

identify at least one rejected data portion selected from the sequential data portions if the subject motion value is above a predetermined threshold; and control the magnetic resonance imaging system to re-acquire the at least one rejected data portion using the pulse sequence commands.

14. The tangible, non-transitory computer readable medium of claim 12, wherein the machine executable instructions, when executed by the processor, further cause the processor to calculate a navigator for each navigator image of each of the sequential data portions.

15. The tangible, non-transitory computer readable medium of claim 14, wherein the machine executable instructions, when executed by the processor, further cause the processor to calculate a navigator for each navigator image of each of the sequential data portions, wherein execution of the machine executable instructions further causes the processor to calculate a motion compensated magnetic resonance image according to the three-dimensional magnetic resonance imaging protocol using the displacement vector field from each navigator image.

* * * * *